United States Patent
Sharma

(10) Patent No.: US 6,809,416 B1
(45) Date of Patent: Oct. 26, 2004

(54) PACKAGE FOR INTEGRATED CIRCUIT WITH THERMAL VIAS AND METHOD THEREOF

(75) Inventor: Nirmal K. Sharma, Fremont, CA (US)

(73) Assignee: Intersil Corporation, Milpitas, CA (US)

( * ) Notice: Subject to any disclaimer, the term of this patent is extended or adjusted under 35 U.S.C. 154(b) by 0 days.

(21) Appl. No.: 10/160,212

(22) Filed: May 28, 2002

(51) Int. Cl.⁷ .......................... H01L 23/10; H01L 23/34
(52) U.S. Cl. ................ 257/706; 257/712; 257/777; 257/787
(58) Field of Search ...................... 257/706, 707, 257/777

(56) References Cited

U.S. PATENT DOCUMENTS

| | | | | |
|---|---|---|---|---|
| 5,815,372 A | * | 9/1998 | Gallas | 361/760 |
| 6,191,477 B1 | * | 2/2001 | Hashemi | 257/706 |
| 6,218,731 B1 | * | 4/2001 | Huang et al. | 257/738 |
| 6,265,771 B1 | * | 7/2001 | Ference et al. | 257/706 |
| 6,353,263 B1 | * | 3/2002 | Dotta et al. | 257/777 |
| 6,462,274 B1 | * | 10/2002 | Shim et al. | 174/52.4 |
| 6,545,366 B2 | * | 4/2003 | Michii et al. | 257/777 |
| 6,621,169 B2 | * | 9/2003 | Kikuma et al. | 257/780 |
| 2002/0185744 A1 | * | 12/2002 | Katagiri et al. | 257/777 |
| 2003/0230799 A1 | * | 12/2003 | Yee et al. | 257/706 |

* cited by examiner

Primary Examiner—John F. Niebling
Assistant Examiner—Angel Roman
(74) Attorney, Agent, or Firm—Edward C. Kwok; MacPherson Kwok Chen & Heid LLP

(57) ABSTRACT

A method for enhancing thermal performance of an integrated circuit package attaches a dummy die to the semiconductor die of the integrated circuit. The dummy die is then thermally coupled through external terminals to the conductive layers of a printed circuit board. In one embodiment, the integrated circuit package includes an insulating substrate on which the dummy die is attached. Conductive vias thermally connect conductive terminals provided on one side of the insulating substrate to conductive terminals provided on the other side of the insulating substrate. In one embodiment, the integrated circuit package is provided as a ball grid array (BGA) package. In addition, multiple layers of conductors can be provided in both the insulating substrate of the integrated circuit and in the external printed circuit board.

8 Claims, 2 Drawing Sheets

PACKAGE FOR INTEGRATED CIRCUIT WITH THERMAL VIAS AND METHOD THEREOF

FIELD OF THE INVENTION

The present invention relates generally to a package for an integrated circuit. In particular, the present invention relates to techniques for achieving a low thermal resistance package for an integrated circuit.

DISCUSSION OF THE RELATED ARTS

The temperature of a PN junction in a semiconductor device is an important parameter that affects the proper operation of the semiconductor device. Thus, the package for an integrated circuit is designed with much emphasis on its ability to dissipate the heat generated during device operation. The thermal performance of a package is typically characterized by several figures of merit: $\theta_{JA}$, $\psi_{JT}$, and $\theta_{JC}$. $\theta_{JA}$ is given by:

$$\theta_{JA} = (T_J - T_A)/P_H$$

where $T_J$ and $T_A$ are respectively the junction and ambient air temperatures, and $P_H$ is the power dissipation of the device. Similarly, $\psi_{JT}$ and $\theta_{JC}$ are given by:

$$\psi_{JT} = (T_J - T_T)/P_H$$

$$\theta_{JC} = (T_J - T_C)/P_H$$

where $T_T$ and $T_C$ are respectively the temperature at the top-center of the package, and the temperature of the case. $\psi_{JT}$ is typically used to estimate junction temperature from a measurement of $T_T$. $\theta_{JC}$ is an important parameter in designing a package to be operated with a heat sink attached to its top surface.

In designing integrated circuits, often times an accurate estimate of the power dissipation of an integrated circuit is not available until after the integrated circuit design is substantially complete, or after the integrated circuit is first fabricated. However, at that stage, if one discovers that the intended package for the integrated circuit would not handle that power dissipation, the corrective options available are limited and expensive. For example, one may consider using a more expensive ceramic package, attach an external heat sink or fan, or redesign the integrated circuit to a lower current density. A redesign of the integrated circuit (e.g., by increasing the die size) is expensive not only because of the additional engineering and manufacturing tooling costs, there are also costs associated with the higher manufacture cost per die and time delay to market.

In one embodiment described below, the present invention provides enhanced heat dissipation performance in an integrated circuit package having multiple semiconductor dies. Integrated circuits having multiple semiconductor dies in one package are known in the prior art. For example, FIG. 1 shows prior art multi-chip module 100 having semiconductor die 104 bonded conventionally (e.g., using thermally conductive adhesive) to semiconductor die 102, which in turn is bonded to insulating substrate 101. Semiconductor die 104 may be, for example, a static random access memory (SRAM) integrated circuit and semiconductor die 102 may be, for example, a "flash" electrically programmable read-only memory ("flash EPROM"). Substrate 101 may be, for example, a printed circuit board coupled by electrical conductors (not shown) on the printed circuit board to external leads of multi-chip module 100. In FIG. 1, bond wires 105a and 105b couple bonding pads of the electronic circuit in semiconductor die 102 to electrical conductors on the printed circuit board. Similarly, bond wires 103a and 103b couple bonding pads of the electronic circuit in semiconductor die 104 to electrical conductors on the printed circuit board.

SUMMARY OF THE INVENTION

A method for enhancing thermal performance of an integrated circuit package attaches a dummy die to the semiconductor die of the integrated circuit. The dummy die is then thermally coupled through external terminals to the conductive layers of a printed circuit board. In one embodiment, the integrated circuit package includes an insulating substrate on which the dummy die is attached. Conductive vias thermally connect conductive terminals provided on one side of the insulating substrate to conductive terminals provided on the other side of the insulating substrate. In one embodiment, the integrated circuit package is provided as a ball grid array (BGA) package. In addition, multiple layers of conductors can be provided in both the insulating substrate of the integrated circuit and in the external printed circuit board.

Because one can increase the size of the dummy die without redesign to increase the surface area from which heat can dissipate, and to allow the number of thermal vias that can be in thermal contact with the dummy die, a power dissipation problem discovered at a late stage of integrated design can be thus corrected very inexpensively.

The present invention is better understood upon consideration of the detailed description below and the accompanying drawings.

BRIEF DESCRIPTION OF THE DRAWINGS

To facilitate cross-reference among the figures and to simplify the detailed description, like elements in the figures are provided like reference numerals.

DETAILED DESCRIPTION OF THE PREFERRED EMBODIMENTS

Figure 1:
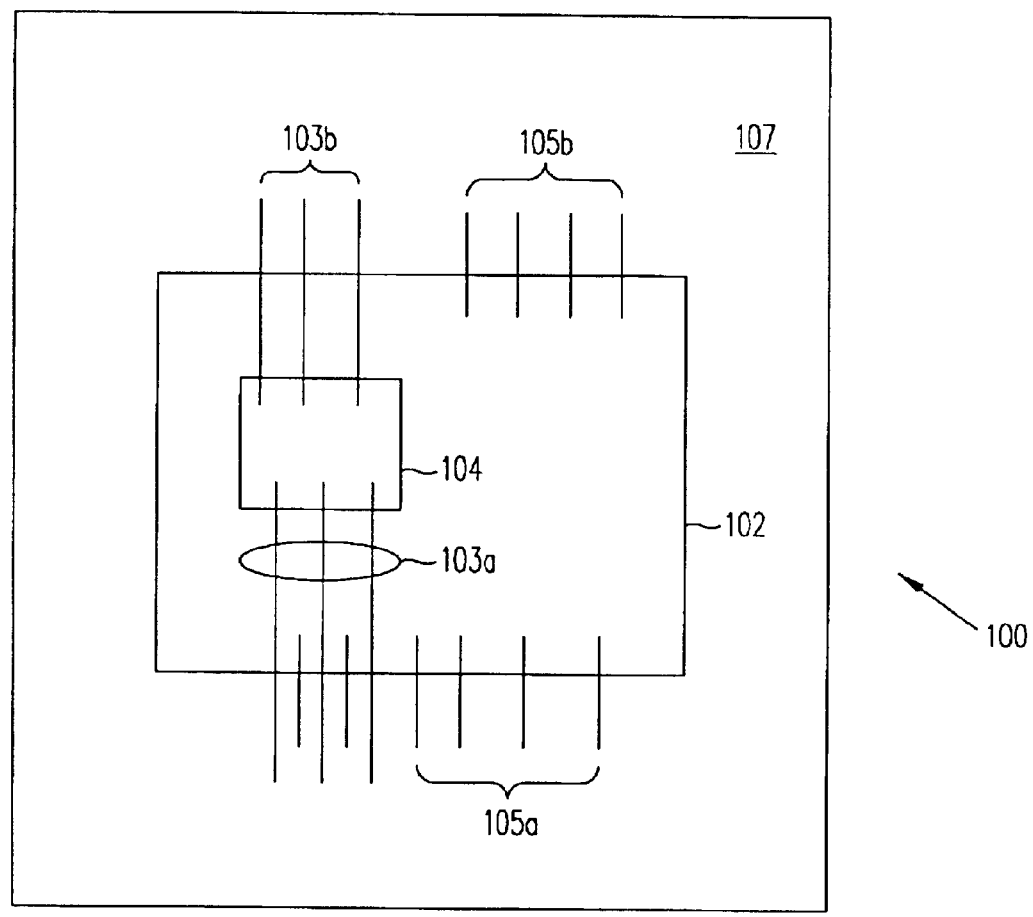
FIG. 1 shows prior art multi-chip module 100 having semiconductor die 104 bonded conventionally to semiconductor die 102.
Figure 2:
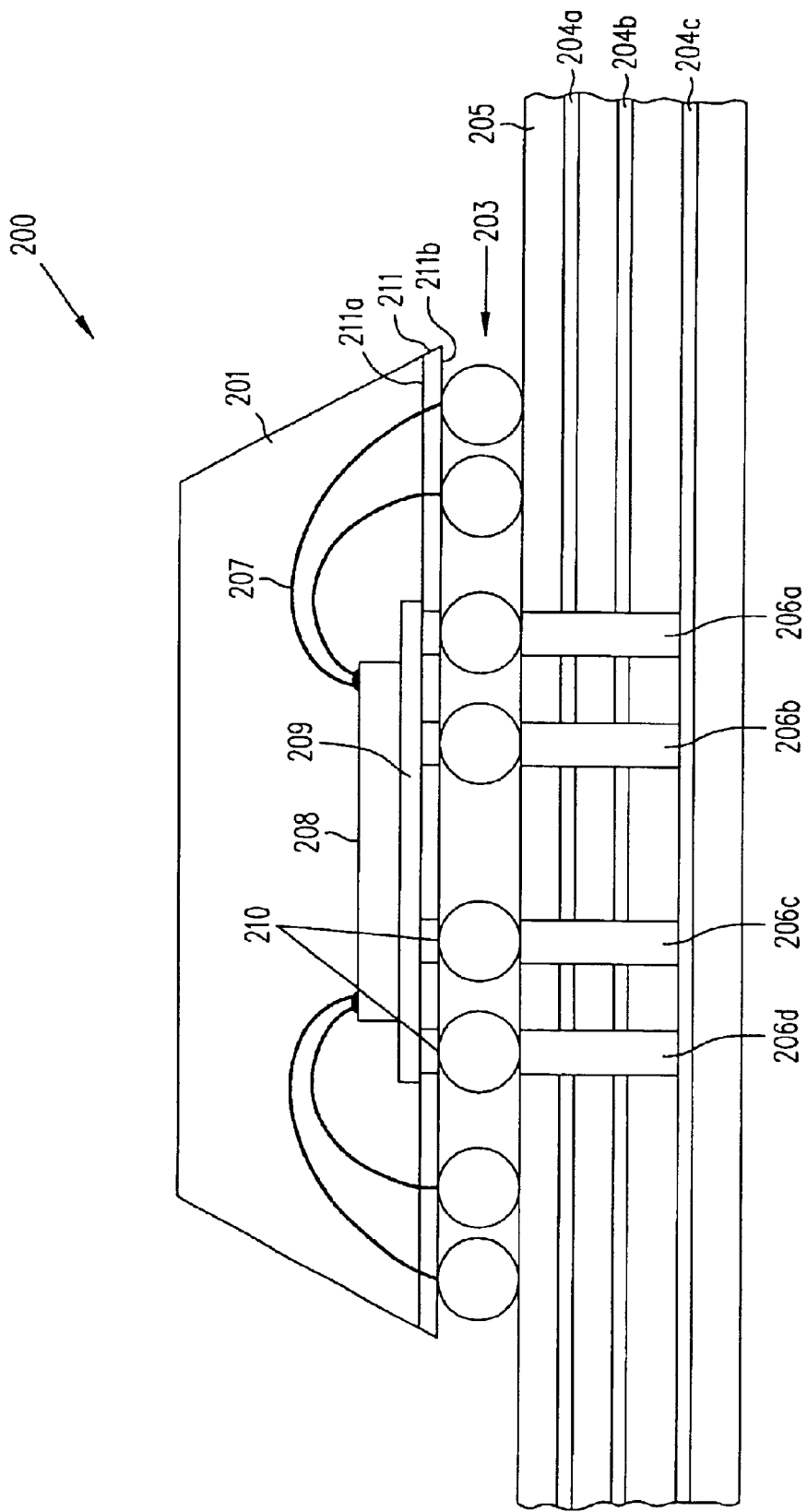
FIG. 2 shows a cross section of a packaged integrated circuit 200 installed on an external printed circuit board 205, in accordance with one embodiment of the present invention.

The present invention provides enhanced thermal performance of an integrated circuit by dissipating heat generated by an electronic circuit in a semiconductor die through thermal vias. FIG. 2 shows a cross section of a packaged integrated circuit 200 installed on external printed circuit board 205, in accordance with one embodiment of the present invention.

As shown in FIG. 2, packaged integrated circuit 201 includes semiconductor die 208 which contains an electronic circuit that dissipates significant amount of heat during operation. For example, in one embodiment, semiconductor die 208 includes a high speed (e.g., 10 gigabits per second) transceiver dissipating power at 1.1 watts (W). In addition, dummy die 209 is provided bonded in a conventional manner to semiconductor die 208. Preferably, dummy die 209 is bonded to semiconductor die 208 using thermally conductive bonding agent, such as a thermally conductive adhesive. Dummy die 209 need not include an operating electronic circuit. In this embodiment, packaged integrated circuit 201 is provided in a ball grid array (BGA) package which attaches to external printed circuit board 205 by an array of solder balls.

Semiconductor die 209 is isolated from the solder ball array by insulating substrate 211. Insulating substrate 211 may be, for example, a polyimide tape or a printed circuit board having one or more conductor layers (e.g., oxygen-free copper) embedded in or laminated on insulating substrate 211. Insulated substrate 211 has surfaces 211a and 211b. Surface 211a of insulated substrate 211 is provided conductive terminals that are in thermal contact with a surface of dummy die 209. Similarly, surface 211b of insulating substrate 211 is provided conductive terminals that are in contact with the solder ball array. The conductive terminals on opposite sides of insulating substrate 211 can be selectively connected by vias 210 in insulating substrate 211. Bond wires 207 connect bonding pads to designated conductive terminals on surface 211a of insulating substrate 211. These conductive terminals couple their respective signals from the electronic circuit on semiconductor die 208 to their respective solder balls in the ball grid array through vias in insulating substrate 211.

As shown in FIG. 2, printed circuit board 205 includes conductive terminals at its top surface and conductive layers 204a, 204b and 204c, which can be interconnected by vias 206a, 206b, 206c and 206d. Under this arrangement, heat generated in semiconductor die 208 can dissipate through dummy die 209, which typically has a larger surface area than semiconductor die 208, to the external through insulating substrate 211, such as through vias 210 in insulating substrate 211. In addition, as shown in FIG. 2, the solder balls coupled to dummy die 209 by vias 210 can further dissipate the heat to the conductive layers 204a, 204b, 204c and 204d through vias 206a, 206b, 206c and 206d.

In one embodiment, packaged integrated circuit 201 is provided in a plastic BGA package that achieves a $\theta_{JA}$ of 27° C./W, which is formerly believed unachievable for a plastic BGA package of its dimension. In that embodiment, semiconductor die 208 is a 3.57 mm by 3.7 mm, 0.8 mm thick semiconductor die. The size of dummy die 209, and hence the number of thermal vias that can be accommodated, is traded-off against the bond wire lengths that are required to make connections to terminals on surface 211a. In that embodiment, the bond wire lengths are kept short to achieve the required high speed transceiver operations. As a result, dummy die 209 is a 6 mm by 6 mm, 0.8 mm thick semiconductor die. The 144 solder balls on the ball grid array are arranged in a square configuration at 0.8 mm pitch, so that there are 85 thermal vias that can be provided underneath dummy die 209, after providing adequate room for bonding electrical input or output signals between the electronic circuit on semiconductor die 208 and the solder balls according to a designated pin-out. The maximum wire length in this embodiment is under 2.2 mm.

The above detailed description is provided to illustrate specific embodiments of the present invention and is not intended to be limiting. Numerous variations and modifications within the scope of the present invention are possible. The present invention is set forth in the following claims.

I claim:

1. A packaged integrated circuit comprising:
   a semiconductor die having provided thereon an electronic circuit;
   a heat spreader in thermal contact with the semiconductor die;
   an insulating substrate having a first surface and a second surface;
   conductive terminals being provided on the first and second surfaces, wherein selected conductive terminals on the first surface are in thermal contact with the heat spreader and connected by vias to selected conductive terminals on the second surface;
   an encapsulation enclosing the semiconductor die and the heat spreader; and
   external terminals adapted for coupling the selected conductive terminals on the second surface to conductors on a printed circuit board.

2. A packaged integrated circuit as in claim 1, wherein the external terminals comprise solder balls.

3. A packaged integrated circuit as in claim 1, further comprising bond wires connecting the electronic circuit to the conductive terminals.

4. A packaged integrated circuit as in claim 1, wherein multiple layers of conductors are provided in the insulating substrate.

5. A packaged integrated circuit as in claim 1, wherein the printed circuit board comprises multiple layers of conductor, and the external terminals couples the selected conductive terminals thermally to the multiple layers of conductor in the printed circuit board.

6. A packaged integrated circuit as in claim 1, wherein the insulating substrate comprises a polyimide tape.

7. A packaged integrated circuit as in claim 1, wherein the insulating substrate comprises a printed circuit board.

8. A packaged integrated circuit as in claim 1 wherein the heat spreader comprises a semiconductor die.

* * * * *